(12) United States Patent
Kull

(10) Patent No.: US 8,766,844 B2
(45) Date of Patent: Jul. 1, 2014

(54) ANALOG-DIGITAL CONVERTER

(75) Inventor: Lukas Kull, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/604,151

(22) Filed: Sep. 5, 2012

(65) Prior Publication Data
US 2013/0082855 A1    Apr. 4, 2013

(30) Foreign Application Priority Data

Sep. 29, 2011  (EP) .................................... 11183341

(51) Int. Cl.
*H03M 1/12*    (2006.01)
(52) U.S. Cl.
CPC ....................................... *H03M 1/12* (2013.01)
USPC ........................................... 341/172; 341/155
(58) Field of Classification Search
CPC ........................................................ H03M 1/12
USPC ................................................. 341/155, 172
See application file for complete search history.

(56) References Cited

U.S. PATENT DOCUMENTS

| | | | |
|---|---|---|---|
| 5,006,853 A | | 4/1991 | Kiriaki et al. |
| 5,583,503 A | | 12/1996 | Kusakabe |
| 5,606,320 A | * | 2/1997 | Kleks .............................. 341/161 |
| 6,268,813 B1 | * | 7/2001 | de Wit ............................ 341/120 |
| 7,170,439 B1 | * | 1/2007 | Chen .............................. 341/172 |
| 7,773,204 B1 | * | 8/2010 | Nelson .......................... 356/5.02 |
| 2011/0133971 A1 | | 6/2011 | Ogawa et al. |
| 2012/0007758 A1 | | 1/2012 | Lee et al. |

FOREIGN PATENT DOCUMENTS

WO    WO 2010/044000 A1    4/2010

OTHER PUBLICATIONS

Combined Search and Examination Report, International Application No. GB1213563.8; Date of Mailing: Nov. 28, 2012; 7 pages.
Jiang et al., "Single-Channel, 1.25-GS/s, 6-bit, Loop-Unrolled Asynchronous SAR-ADC in 40nm-CMOS," IEEE, 2010, 4 pages.
T. Jiang et al., "Single channel, 1.25-GS/s, 6-Bit, Loop-Unrolled Asynchronous SAR-ADC in 40nm-CMOS", IEEE 2010.
S. G. Talekar and S. Ramasamy, "A Low Power 700MSPS 4bit Time Interleaved SAR ADC in 0.18 μm CMOS", TENCON 2009.

* cited by examiner

*Primary Examiner* — Jean B Jeanglaude
(74) *Attorney, Agent, or Firm* — Cantor Colburn LLP

(57) ABSTRACT

A method and apparatus for operating an analog-digital converter for converting an input signal into a multibit output in one conversion cycle. The method includes loading a capacitor array by applying a given input signal potential, evaluating a sampling potential provided by the capacitor array in a number of consecutive decision steps performed by at least two decision latches and changing the sampling potential by switching the capacitor array for each decision step based on a result of the step of evaluating the sampling potential, where the step of evaluating at least one of the decision latches performs the evaluating for two decision steps.

18 Claims, 4 Drawing Sheets

ANALOG-DIGITAL CONVERTER

CROSS-REFERENCE TO RELATED APPLICATION

This application claims priority under 35 U.S.C. §119 from European Patent Application No. 11183341.4 filed Sep. 29, 2011, the entire contents of which are incorporated herein by reference.

BACKGROUND OF THE INVENTION

1. Field of the Invention

The present invention relates to analog-digital converters, in particular to successive approximation register (SAR) analog-digital converters and measures to increase their speed without sacrificing power efficiency.

2. Description of Related Art

SAR converters are frequently used in integrated CMOS devices since they provide a reasonable resolution and conversion time and can be implemented by optimally utilizing the advantages of the CMOS technology, which are small-sized switches and capacitors having well-defined relative capacitances. SAR converters generally include at least one capacitor array with capacitors of different values forming a 2C-C network or forming a capacitance ladder with capacitance values having a relation of a factor of $2^n$ (n: number of stages) between one another.

The capacitors of the capacitor array are charged by connecting them to a signal line carrying the input signal to be converted. The capacitor array is connected to a latch which serves for comparing a potential stored in the capacitor array to a reference potential in a sampling phase. The comparison result is stored in a shift register. Based on the comparison result of the previous sampling phase, a switching of a capacitor of the capacitor array is performed to increase or decrease the potential stored in the capacitor array.

In a different kind of SAR analog-digital converter a switching associated to a respective capacitance in the capacitor array is performed prior to comparing the stored potential to the reference potential and based on the comparison result the switching state of the last switching is maintained as it is or is switched back to the original switching state.

The performance characteristics of an SAR analog-digital converter are generally related to power consumption, conversion precision, and conversion speed. Improving one of these characteristics often requires a compromise as the other performance characteristics are affected. For instance, for converters with a very fast capacitor settling speed, the delay of the logic and capacitor settling can be shorter than the latch reset time. With respect to the conversion speed the operation of the decision latch becomes a limiting factor since after each conversion step the decision latch has to be reset to keep the conversion offset low and to maintain the conversion precision.

While the reset time is significantly longer than the times that are needed for processing of the latch results and the adjusting of the latch input voltage by switching a respective switch in the capacitor array, the reset time is critical and substantially contributes to the latch cycle period of the analog-digital converter.

Document WO 2010/044000 A1 discloses an analog-digital converter having two subconverters which are operated in an interleaved manner, wherein a track-and-hold stage on the input side of the capacitor array is shared to eliminate calibration issues.

Document S. G. Talekar and S. Ramasamy, "A Low Power 700MSPS 4 bit Time Interleaved SAR ADC in 0.18 μm CMOS", TENCON 2009, discloses an analog-digital converter with multiple comparators. The multiple comparators are operable to convert more than 1 Bit per comparison step.

Document T. Jiang et al., "Single channel, 1.25-GS/s, 6-Bit, Loop-Unrolled Asynchronous SAR-ADC in 40 nm-CMOS", IEEE 2010, discloses an analog-digital converter having a number of latches corresponding to the number of bits of the conversion. This results in an increased calibration time and complexity for each of the decision latches, so that the benefit concerning speed is minimal. Furthermore, the total area for implementing the decision latches in an integrated manner is significant.

SUMMARY OF THE INVENTION

According to one aspect of the invention, a method for operating an analog-digital converter for converting an input signal into a multibit output in one conversion cycle is provided. The method includes loading a capacitor array by applying a given input signal potential, evaluating a sampling potential provided by the capacitor array in a number of consecutive decision steps performed by at least two decision latches and changing the sampling potential by switching the capacitor array for each decision step based on a result of the step of evaluating the sampling potential, where the step of evaluating at least one of the decision latches performs the evaluating for two decision steps.

In another aspect of the invention a analog-digital converter for converting an input signal into a multibit output in one conversion cycle is provided. The convert includes a capacitor array for being loaded by applying a given input signal potential and for providing a sampling potential, a number of decision latches for evaluating the sampling potential in a number of consecutive decision steps, and a logic unit for changing the sampling potential by switching the capacitor array for each decision step based on an evaluating result of a previous decision step, where the converter is configured to control the decision latches so that at least one of the decision latches perform the evaluating for two decision steps.

BRIEF DESCRIPTION OF THE DRAWINGS

Preferred embodiments of the present invention are described, by way of example only, with reference to the accompanying drawings, in which.

DETAILED DESCRIPTION OF THE PREFERRED EMBODIMENTS

According to embodiments of the invention, since the overall power consumption is dominated by the number of latch decisions the total power consumption does substantially not increase. Moreover, since the requirements on the latch reset time are more relaxed, power can be saved by optimizing the design of the decision latch. The area penalty at CMOS integration caused by the provision of one or more further latches is generally negligible since the decision latch area is much smaller than the total analog-digital converter area which is dominated by the capacitor area and the area of the digital logic.

Furthermore, electromigration problems can be more relaxed since each latch is only used for a part of the decisions and therefore the average power consumption is decreased. Additionally, the calibration effort and logic remain mostly unchanged in complexity.

According to embodiments of the invention, an analog-digital converter can be provided having an increased speed and a decreased latency, which is particularly important for very high speed analog-digital converters where a number of slower subconverters are used in parallel in order to achieve the required performance. The sub-analog-digital converters having a higher conversion speed enable an increased reusability of a design and are essential for a very high speed solution, such as 100 GBit internet and following standards. Lower latency furthermore enables applications where the analog-digital converter is in a critical feedback path.

Furthermore, the above-proposed interleaved latch topologies can be able to achieve conversion speeds that are competitive with high speed analog-digital converters of different conversion types.

Figure 1:
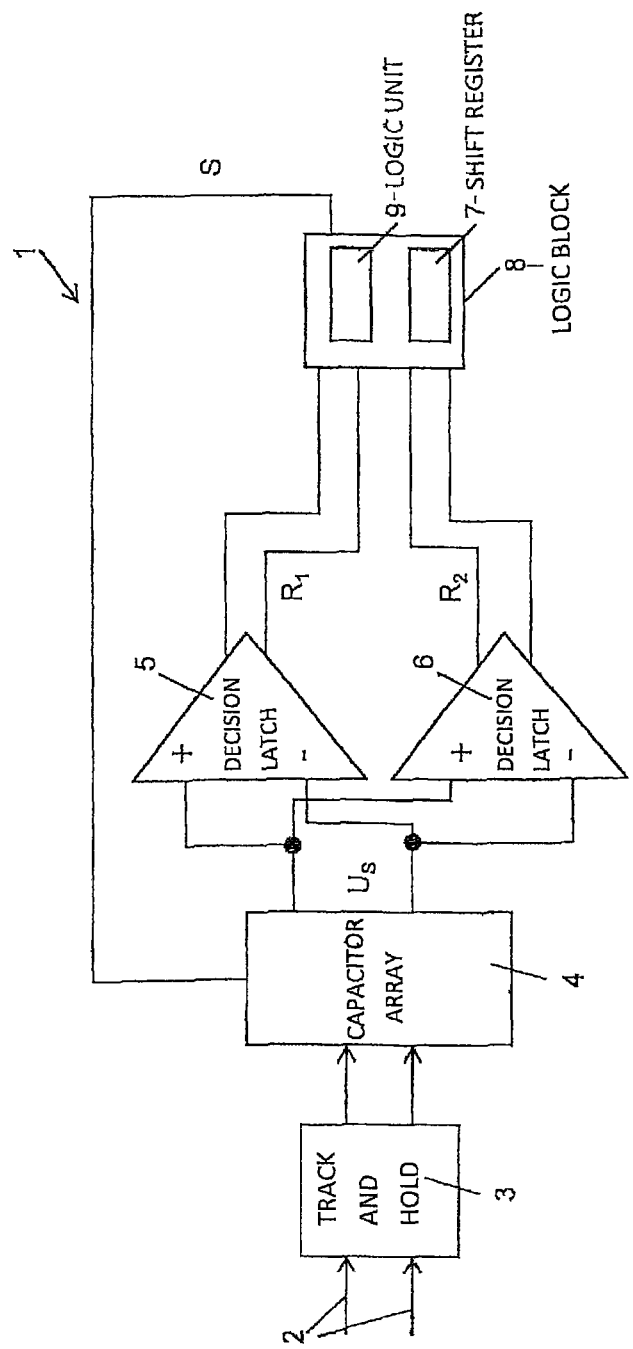
FIG. 1 shows a schematic of the basic architecture of a successive approximation register analog-digital converter according to an embodiment.

FIG. 1 schematically shows a block diagram of a successive approximation register analog-digital converter SAR-ADC 1. An input signal received at input lines 2 is fed to a track-and-hold unit 3 which conserves the voltage value of the input signal at a specific point of time and supplies the hold input signal voltage to a capacitor array 4 (capacitor bank). The hold input signal voltage is used to precharge capacitors of the capacitor array 4. Each capacitor is charged in response to the supplied input signal voltage.

The capacitor array 4 can be implemented in a 2C-C topology or in a topology where the capacitances between the capacitor of the capacitor array 4 differ by a factor of $2^n$ (n= 1 ... n, n: number of stages). In further embodiments, the basis of this factor can also be smaller than 2 if redundancy is provided. Although there are many implementations, the basic principle remains the same.

Figure 2:
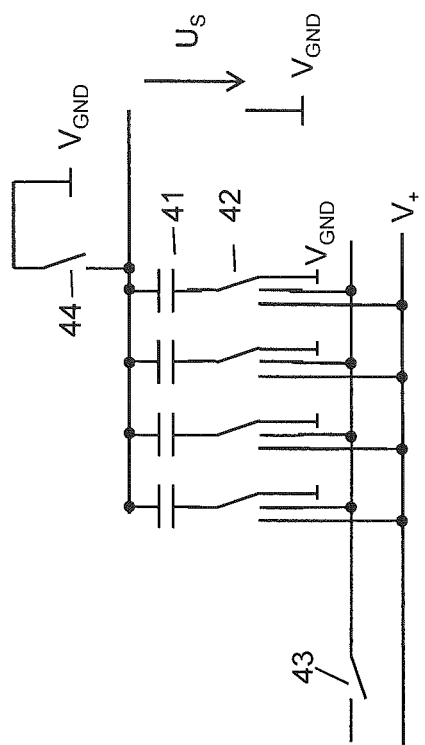
FIG. 2 shows an example for a capacitor array as can be used in the analog-digital converter of FIG. 1.

As shown in more detail in FIG. 2, the capacitor array 4 can be implemented with a number of capacitors 41 switched by switches 42 serially associated to capacitors 41. The switches 42 are capable of being switched to three states, a first switching state for connecting with the track-and-hold-unit 43, a second switching state for connecting with a ground potential $V_{GND}$ and a third switching state for connecting with a positive reference potential $V_+$.

By closing of precharging switches 43, 44 the capacitors 41 are connected with the track-and-hold unit 3 to receive the hold input signal potential so that the capacitors 41 can be precharged with the hold input signal potential (or voltage). After precharging, the precharging switches 43, 44 are opened so that a charge remains stored in the capacitors 41. For providing the sampling voltage $U_S$ for each decision the switching state of the switches 42 is consecutively determined and set so that the voltage stored in the capacitors 41 is changed to obtain the sampling voltage $U_S$.

The capacitor array 4 provides the sampling voltage $U_S$ which corresponds to the supplied input signal voltage before any switching is made. The sampling voltage $U_S$ is applied to a first decision latch 5 and a second decision latch 6 simultaneously. Preferably, the sampling voltage $U_S$ is directly coupled with the inputs of the decision latches 5, 6, i.e. without using passive components and/or additional switches.

The decision latches 5, 6 can correspond to conventional operational amplifiers and be operable to evaluate the sampling voltage $U_S$ at their inputs and to provide a digital decision result indicating whether the sampling voltage $U_S$ is positive or negative with respect to a given reference potential, e.g. ground potential. Prior to each evaluating the decision latches need to be reset.

Figure 3:
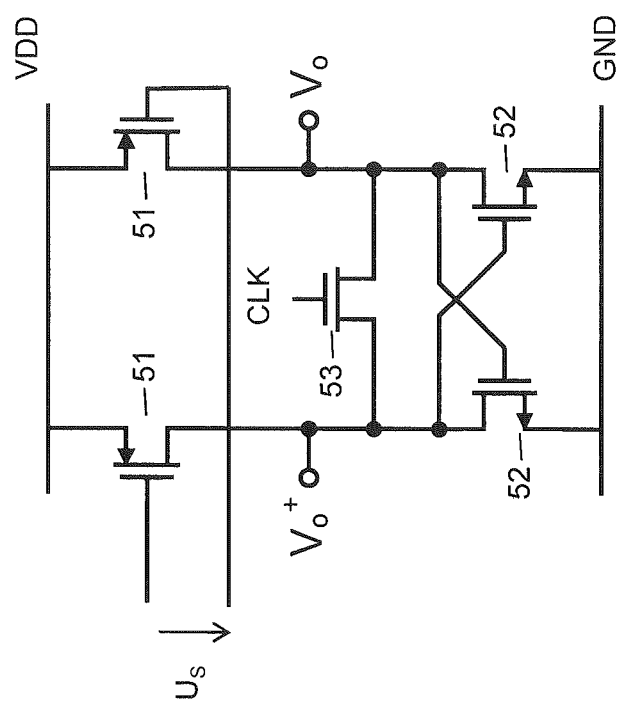
FIG. 3 shows an example for a differential amplifier with a reset circuit as can be used in a decision latch of the analog-digital converter of FIG. 1.

In FIG. 3 a decision latch is exemplarily shown. It represents a bistable latch circuit with two branches with input MOSFETs 51 connected in series with cross-coupled MOSFETs 52. The sampling voltage $U_S$ is applied to gate terminals of the input MOSFETs 51. Source terminals of the input MOSFETs 51 are connected with supply potential VDD while its drain terminals are connected with drain terminals of the pull-down MOSFETs 52 and are forming output nodes. The sources of the pull-down MOSFETs 52 are connected with a ground potential GND. The gates of the pull-down MOSFETs 52 are each connected with the drains of the pull-down MOSFET 52 of the respective other branch.

Between drain terminals of the input MOSFETs 51 (or between the output nodes) a reset MOSFET 53 is arranged to equalize the potentials of the output nodes after each evaluating. The reset MOSFET 53 is operated by means of a respective clock signal CLK. In its closed state the potentials of the output nodes are equalized while in its open state the latch is in operable condition to latch a sampling voltage.

The decision results are collected and stored in a memory, such as a shift register 7 of a logic block 8, in which a switching signal S is generated. The logic block 8 further includes a logic unit 9 which operates the decision results stored in the shift register 7 in order to obtain command signals S indicating the switching states of the switches of the capacitor array 4.

The logic unit 9 as well as the capacitor array 4 can be operated in a synchronous manner or an asynchronous manner. In an asynchronous operation, the command signals S are adapted to provide the updated switching states to the capacitor array 4 as soon as the decision results are available in the shift register 7.

The decision latches 5, 6 are clocked by a first clock signal CLK1 and a second clock signal CLK2, such that the operation phases of the decision latches 5, 6 are phase-shifted. The decision latches 5, 6 are configured to start an evaluation of the sampling voltage on one level of the respective clock signal and to reset on another level of the clock signal. The operation phases of a decision latch 5, 6 include the latch decision where the sampling voltage $U_S$ is assessed and a decision result signal R is generated. After the decision result R has been latched into the shift register 7, the decision latch 5, 6 has to be reset into a defined condition. The resetting of a decision latch 5, 6 has a duration that is substantially in the same order as the time needed to assess the sampling voltage $U_S$.

Although the generating of the command signal S is started as soon as the comparison result R has been obtained, the reset time of a decision latch 5, 6 determines the time until the next sampling step can be performed. Therefore, it is now proposed to operate the first and the second decision latches 5, 6 in an alternating fashion, so that a decision step can be performed in one of the decision latches 5, 6 while the respective other decision latch resets. As both decision time and reset time of the latches 5, 6 are in the same order, the resetting of a decision latch 5, 6 can be almost fully performed within the time interval in which the respective other latch performs its decision step.

Figure 4:
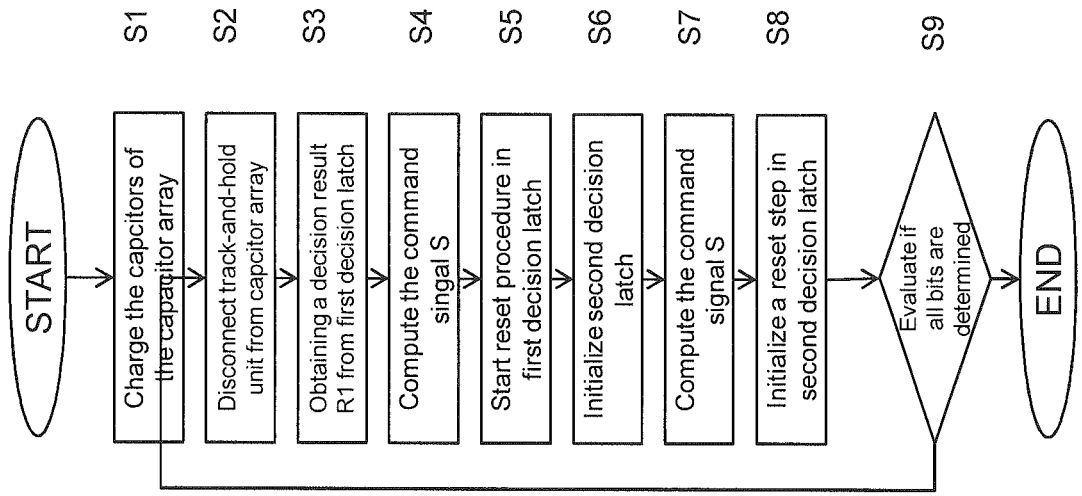
FIG. 4 a flow diagram illustrating the operation of the analog-digital converter of FIG. 1.

The steps illustrating the operation of the SAR-ADC 1 of FIG. 1 are shown in the flow chart of FIG. 4. After the input signal is held in the track-and-hold unit 3 the capacitors of the capacitor array 4 are charged in response to the input signal voltage supplied by the track-and-hold unit 3 (step S1). This accomplished, the track-and-hold unit 3 is disconnected from the capacitor array 4 (step S2) and a decision is made in the first decision latch 5 (Step S3), thereby obtaining a decision result $R_1$ which is provided to the shift register 7 in the logic block 8.

As soon as the first decision result $R_1$ has been obtained, the logic unit 9 computes the command signal S (step S4) indicating a change or non-change of the switching states of the switches of the capacitor array 4.

Depending on the decision result, a capacitor associated with the most significant bit is coupled with a different potential, thereby changing the sampling voltage $U_S$, or not. After the first decision result $R_1$ has been obtained and latched into the shift register 7, a reset procedure is started in the first decision latch 5 (step S5) while the second decision latch 6 is initiated to evaluate the sampling voltage $U_S$ (step S6) after the switching has been performed to prepare the sampling voltage $U_S$ for the next decision step.

The decision step is performed in the second latch 6 while the first decision latch 5 is resetting. After the second decision result $R_2$ has been obtained and latched into the shift register 7, the logic unit 9 computes the command signals S (step S7) to set the switching states of the switches of the capacitor array 4 depending on the recently received decision result. After the second decision result $R_2$ has been latched into the shift register 7, a reset step is initiated in the second decision latch 6 (step S8) while the next comparison step is performed by the first decision latch 5 by going back to step S3.

In step S9 it is determined whether all bits of the conversion have been determined or not. If positive the conversion ends with step S10. If negative, the method is continued with step S3. Consequently, the decision latches 5, 6 are operated in an alternating manner, so that a decision step and a resetting step are concurrently performed in the two decision latches 5, 6.

In different embodiments, the number of decision latches used in parallel is variable. However, the number of decision latches should be kept lower than the number of bits of the conversion in order to avoid the area penalty of the additional decision latches in an integrated environment and to avoid calibration issues since the decision latches need to have the same offset to avoid precision degradation.

After each one conversion cycle or after a number of conversion cycles, the decision latches 5, 6 are calibrated by setting the sampling voltage $U_S$ to zero. However, in order to decrease interdependent effects on the calibration routines of the decision latches 5, 6, the calibration should also be performed in an alternating manner after each conversion cycle. The frequency of calibration required for the latches 5, 6 can be made dependant on the resolution and characteristics of the latch 5, 6.

I claim:

1. A method for operating an analog-digital converter for converting an input signal into a multibit output in one conversion cycle, the method comprising the steps of:
    loading a capacitor array by applying a given input signal potential;
    evaluating a sampling potential provided by the capacitor array in a number of consecutive decision steps performed by at least two decision latches; and
    changing the sampling potential by switching the capacitor array for each decision step based on a result of the step of evaluating the sampling potential, wherein the step of evaluating at least one of the decision latches performs the evaluating for two decision steps;

wherein the decision latches further comprise a bistable latch circuit with two branches including pull-up MOSFETs connected in series with cross-coupled pull-down MOSFETs, with the sampling potential applied to gate terminals of the pull-up MOSFETs, wherein source terminals of the pull-up MOSFETs are connected with a supply potential drain terminals of the pull-up MOSFETs are connected with drain terminals of the pull-down MOSFETs and form output nodes, and wherein source terminals of the pull-down MOSFETs are connected with a ground potential, and gates terminals of the pull-down MOSFETs are connected with the source terminals of the pull-down MOSFET of the respective other branch.

2. The method according to claim 1, wherein, after or before the at least one of the decision latches performs the evaluating for one decision step, the decision latch is reset.

3. The method according to claim 2, wherein one of the decision steps is performed in another one of the decision latches while the at least one decision latch is resetting.

4. The method according to claim 2, wherein two decision latches perform the steps of evaluating and resetting alternately while a resetting is performed in each decision latch after one decision step and before a succeeding decision step.

5. The method according to claim 3, wherein two decision latches perform the steps of evaluating and resetting alternately while a resetting is performed in each decision latch after one decision step and before a succeeding decision step.

6. The method according to claim 1, wherein, after and before the at least one of the decision latches performs the evaluating for one decision step, the decision latch is reset.

7. An analog-digital; converter for converting an input signal into a multibit output in one conversion cycle, comprising:
    a capacitor array for being loaded by applying a given input signal potential and for providing a sampling potential;
    a number of decision latches for evaluating the sampling potential in a number of consecutive decision steps; and
    a logic unit for changing the sampling potential by switching the capacitor array for each decision step based on an evaluating result of a previous decision step, wherein the converter is configured to control the decision latches so that at least one of the decision latches perform the evaluating for two decision steps;
wherein the decision latches further comprise a bistable latch circuit with two branches including pull-up MOSFETs connected in series with cross-coupled pull-down MOSFETs, with the sampling potential applied to gate terminals of the pull-up MOSFETs, wherein source terminals of the pull-up MOSFETs are connected with a supply potential drain terminals of the pull-up MOSFETs are connected with drain terminals of the pull-down MOSFETs and form output nodes, and wherein source terminals of the pull-down MOSFETs are connected with a ground potential, and gates terminals of the pull-down MOSFETs are connected with the source terminals of the pull-down MOSFET of the respective other branch.

8. The analog-digital converter according to claim 7, wherein the decision latches are configured to start an evaluation on one level of a clock signal and to reset on another level of the clock signal while at least two of the decision latches are clocked with clock signals which are phase-shifted.

9. The analog-digital converter according to claim 7, wherein the decision latches are provided with a differential amplifier wherein branches of the differential amplifier are provided with a crowbar to shortcut the branches.

10. The analog-digital converter according to claim 8, wherein the decision latches are provided with a differential amplifier wherein branches of the differential amplifier are provided with a crowbar to shortcut the branches.

11. The analog-digital converter according to claim 7, wherein the capacitor array has a 2C-C-topology or a topology corresponding to a capacitance ladder.

12. The analog-digital converter according to claim 8, wherein the capacitor array has a 2C-C-topology or a topology corresponding to a capacitance ladder.

13. The analog-digital converter according to claim 9, wherein the capacitor array has a 2C-C-topology or a topology corresponding to a capacitance ladder.

14. The analog-digital converter according to claim 10, wherein the capacitor array has a 2C-C-topology or a topology corresponding to a capacitance ladder.

15. The analog-digital converter according to claim 7, wherein the capacitor array is directly coupled with each of the decision latches.

16. The analog-digital converter according to claim 8, wherein the capacitor array is directly coupled with each of the decision latches.

17. The analog-digital converter according to claim 9, wherein the capacitor array is directly coupled with each of the decision latches.

18. The analog-digital converter according to claim 10, wherein the capacitor array is directly coupled with each of the decision latches.

* * * * *